(12) United States Patent
Li

(10) Patent No.: US 11,150,986 B2
(45) Date of Patent: Oct. 19, 2021

(54) EFFICIENT COMPACTION ON LOG-STRUCTURED DISTRIBUTED FILE SYSTEM USING ERASURE CODING FOR RESOURCE CONSUMPTION REDUCTION

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

(*) Notice: Subject to any disclaimer, the term of this patent is extended or adjusted under 35 U.S.C. 154(b) by 0 days.

(21) Appl. No.: 16/802,151

(22) Filed: Feb. 26, 2020

(65) Prior Publication Data
US 2021/0263795 A1    Aug. 26, 2021

(51) Int. Cl.
G06F 11/10    (2006.01)
H03M 13/15    (2006.01)

(52) U.S. Cl.
CPC ....... *G06F 11/1068* (2013.01); *H03M 13/154* (2013.01)

(58) Field of Classification Search
CPC .................... H03M 13/154; G06F 11/1068
See application file for complete search history.

(56) References Cited

U.S. PATENT DOCUMENTS

| | | |
|---|---|---|
| 3,893,071 A | 7/1975 | Bossen |
| 4,562,494 A | 12/1985 | Bond |
| 4,718,067 A | 1/1988 | Peters |
| 4,775,932 A | 10/1988 | Oxley |
| 4,858,040 A | 8/1989 | Hazebrouck |
| 5,394,382 A | 2/1995 | Hu |
| 5,602,693 A | 2/1997 | Brunnett |
| 5,732,093 A | 3/1998 | Huang |
| 5,802,551 A | 9/1998 | Komatsu |

(Continued)

FOREIGN PATENT DOCUMENTS

| | | |
|---|---|---|
| JP | 2003022209 | 1/2003 |
| JP | 2011175422 | 9/2011 |

(Continued)

OTHER PUBLICATIONS

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

(Continued)

*Primary Examiner* — Guy J Lamarre
(74) *Attorney, Agent, or Firm* — Shun Yao; Park, Vaughan, Fleming & Dowler LLP

(57) ABSTRACT

One embodiment described herein provides a system and method for data compaction in a storage system comprising a plurality of storage nodes. During operation, in response to determining that data compaction is triggered, the system regroups valid data from a first set of data chunks stored in the storage system into a second set of data chunks such that a respective data chunk from the second set of data chunks comprises contiguous valid data slices. The system further performs error-correction-coding protection on the second set of data chunks. A physical location associated with a respective valid data slice remains unchanged subsequent to the error-correction-coding protection.

20 Claims, 10 Drawing Sheets

(56) References Cited

U.S. PATENT DOCUMENTS

| | | |
|---|---|---|
| 6,098,185 A | 8/2000 | Wilson |
| 6,148,377 A | 11/2000 | Carter |
| 6,226,650 B1 | 5/2001 | Mahajan et al. |
| 6,243,795 B1 | 6/2001 | Yang |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 8,260,924 B2 | 9/2012 | Koretz |
| 8,452,819 B1 | 5/2013 | Sorenson, III |
| 8,516,284 B2 | 8/2013 | Chan |
| 8,751,763 B1 | 6/2014 | Ramarao |
| 8,825,937 B2 | 9/2014 | Atkisson |
| 8,868,825 B1 | 10/2014 | Hayes |
| 8,904,061 B1 | 12/2014 | O'Brien, III |
| 8,949,208 B1 | 2/2015 | Xu |
| 9,015,561 B1 | 4/2015 | Hu |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,141,176 B1 | 9/2015 | Chen |
| 9,208,817 B1 | 12/2015 | Li |
| 9,280,472 B1 | 3/2016 | Dang |
| 9,280,487 B2 | 3/2016 | Candelaria |
| 9,311,939 B1 | 4/2016 | Malina |
| 9,336,340 B1 | 5/2016 | Dong |
| 9,436,595 B1 | 9/2016 | Benitez |
| 9,529,601 B1 | 12/2016 | Dharmadhikari |
| 9,588,698 B1 | 3/2017 | Karamcheti |
| 9,588,977 B1 | 3/2017 | Wang |
| 9,607,631 B2 | 3/2017 | Rausch |
| 9,747,202 B1 | 8/2017 | Shaharabany |
| 9,852,076 B1 | 12/2017 | Garg |
| 9,875,053 B2 | 1/2018 | Frid |
| 10,013,169 B2 | 7/2018 | Fisher |
| 10,199,066 B1 | 2/2019 | Feldman |
| 10,235,198 B2 | 3/2019 | Qiu |
| 10,318,467 B2 | 6/2019 | Barzik |
| 10,437,670 B1 | 10/2019 | Koltsidas |
| 10,649,657 B2 | 5/2020 | Zaidman |
| 2001/0032324 A1 | 10/2001 | Slaughter |
| 2002/0010783 A1 | 1/2002 | Primak |
| 2002/0039260 A1 | 4/2002 | Kilmer |
| 2002/0073358 A1 | 6/2002 | Atkinson |
| 2002/0095403 A1 | 7/2002 | Chandrasekaran |
| 2002/0161890 A1 | 10/2002 | Chen |
| 2003/0074319 A1 | 4/2003 | Jaquette |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0143718 A1 | 7/2004 | Chen |
| 2004/0255171 A1 | 12/2004 | Zimmer |
| 2004/0268278 A1 | 12/2004 | Hoberman |
| 2005/0038954 A1 | 2/2005 | Saliba |
| 2005/0097126 A1 | 5/2005 | Cabrera |
| 2005/0149827 A1 | 7/2005 | Lambert |
| 2005/0174670 A1 | 8/2005 | Dunn |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0156012 A1 | 7/2006 | Beeson |
| 2007/0033323 A1 | 2/2007 | Gorobets |
| 2007/0101096 A1 | 5/2007 | Gorobets |
| 2008/0034154 A1 | 2/2008 | Lee |
| 2008/0065805 A1 | 3/2008 | Wu |
| 2008/0082731 A1 | 4/2008 | Karamcheti |
| 2009/0089544 A1 | 4/2009 | Liu |
| 2009/0113219 A1 | 4/2009 | Aharonov |
| 2009/0282275 A1 | 11/2009 | Yermalayeu |
| 2009/0287956 A1 | 11/2009 | Flynn |
| 2009/0307249 A1 | 12/2009 | Koifman |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0321999 A1 | 12/2010 | Yoo |
| 2010/0325367 A1 | 12/2010 | Kornegay |
| 2010/0332922 A1 | 12/2010 | Chang |
| 2011/0055458 A1 | 3/2011 | Kuehne |
| 2011/0055471 A1 | 3/2011 | Thatcher |
| 2011/0072204 A1 | 3/2011 | Chang |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0252188 A1 | 10/2011 | Weingarten |
| 2011/0258514 A1 | 10/2011 | Lasser |
| 2011/0289263 A1* | 11/2011 | McWilliams ....... G06F 12/0802 711/103 |
| 2011/0292538 A1 | 12/2011 | Haga |
| 2011/0302353 A1 | 12/2011 | Confalonieri |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2013/0013880 A1 | 1/2013 | Tashiro |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0191601 A1 | 7/2013 | Peterson |
| 2013/0219131 A1 | 8/2013 | Alexandron |
| 2013/0238955 A1 | 9/2013 | D Abreu |
| 2013/0318283 A1 | 11/2013 | Small |
| 2013/0318395 A1 | 11/2013 | Kalavade |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0095827 A1 | 4/2014 | Wei |
| 2014/0108414 A1 | 4/2014 | Stillerman |
| 2014/0181532 A1 | 6/2014 | Camp |
| 2014/0195564 A1 | 7/2014 | Talagala |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |

(56) References Cited

U.S. PATENT DOCUMENTS

| | | |
|---|---|---|
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0294684 A1 | 10/2015 | Qjang |
| 2015/0301964 A1 | 10/2015 | Brinicombe |
| 2015/0304108 A1 | 10/2015 | Obukhov |
| 2015/0347025 A1 | 12/2015 | Law |
| 2015/0363271 A1 | 12/2015 | Haustein |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048341 A1 | 2/2016 | Constantinescu |
| 2016/0077749 A1 | 3/2016 | Ravimohan |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0154601 A1 | 6/2016 | Chen |
| 2016/0162187 A1 | 6/2016 | Lee |
| 2016/0188223 A1 | 6/2016 | Camp |
| 2016/0188890 A1 | 6/2016 | Naeimi |
| 2016/0203000 A1 | 7/2016 | Parmar |
| 2016/0232103 A1 | 8/2016 | Schmisseur |
| 2016/0239074 A1 | 8/2016 | Lee |
| 2016/0239380 A1 | 8/2016 | Wideman |
| 2016/0274636 A1 | 9/2016 | Kim |
| 2016/0306699 A1* | 10/2016 | Resch .................. G06F 3/0619 |
| 2016/0306853 A1 | 10/2016 | Sabaa |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0272100 A1* | 9/2017 | Yanovsky .............. G06F 3/0619 |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0088867 A1 | 3/2018 | Kaminaga |
| 2018/0107591 A1 | 4/2018 | Smith |
| 2018/0143780 A1 | 5/2018 | Cho |
| 2018/0150640 A1 | 5/2018 | Li |
| 2018/0167268 A1 | 6/2018 | Liguori |
| 2018/0173620 A1 | 6/2018 | Cen |
| 2018/0189182 A1 | 7/2018 | Wang |
| 2018/0212951 A1 | 7/2018 | Goodrum |
| 2018/0226124 A1 | 8/2018 | Perner |
| 2018/0232151 A1 | 8/2018 | Badam |
| 2018/0270110 A1 | 9/2018 | Chugtu |
| 2018/0300203 A1 | 10/2018 | Kathpal |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0357126 A1* | 12/2018 | Dhuse ................. G06F 11/1076 |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0065085 A1 | 2/2019 | Jean |
| 2019/0073262 A1 | 3/2019 | Chen |
| 2019/0087115 A1 | 3/2019 | Li |
| 2019/0171532 A1 | 6/2019 | Abadi |
| 2019/0205206 A1 | 7/2019 | Hornung |
| 2019/0227927 A1 | 7/2019 | Miao |
| 2019/0272242 A1 | 9/2019 | Kachare |
| 2019/0278654 A1 | 9/2019 | Kaynak |
| 2019/0339998 A1 | 11/2019 | Momchilov |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0097189 A1 | 3/2020 | Tao |
| 2020/0159425 A1 | 5/2020 | Flynn |
| 2020/0401334 A1* | 12/2020 | Saxena ................. G06F 3/0604 |

FOREIGN PATENT DOCUMENTS

| | | |
|---|---|---|
| WO | 9418634 | 8/1994 |
| WO | 1994018634 | 8/1994 |

OTHER PUBLICATIONS

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime, "Design, Automation & Text in Europe Conference & Exhibition (DATE), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

(56) References Cited

OTHER PUBLICATIONS

WOW: Wise Ordering for Writes—Combining Spatial and Temporal Locality in Non-Volatile Caches by Gill (Year: 2005).
Helen H. W. Chan et al. "HashKV: Enabling Efficient Updated in KV Storage via Hashing", https://www.usenix.org/conference/atc18/presentation/chan, (Year: 2018).

* cited by examiner

EFFICIENT COMPACTION ON LOG-STRUCTURED DISTRIBUTED FILE SYSTEM USING ERASURE CODING FOR RESOURCE CONSUMPTION REDUCTION

BACKGROUND

Field

This disclosure is generally related to storage systems. More specifically, this disclosure is related to a system and method for efficient compaction operations in storage systems.

Related Art

A distributed file system (DFS) allows multiple users on multiple machines to share files and storage resources. DFS can improve the file availability and increase scalability and interoperability. A typical DFS can receive files from multiple clients and group them in chunks before writing the chunks into the storage medium. The DFS does not support in-place updates and can be log-structured, meaning that the files are written in an append-only manner. When the updated version of a file is written, the old version of the file is invalidated and needs to be recycled. The invalid data creates holes in existing chunks, as shown in FIG. 1. Considering that the write is append only, the space holding the invalid data needs to be recycled to form new chunks for the sequential write. The process to merge the chunks with holes (or invalid data) is called compaction.

Erasure-coding techniques have been used to reduce the burden of compaction. Compared to other methods that produce multiple replicas, erasure-coding-based compaction can reduce the total amount of recycled data. However, conventional erasure-coding-based compaction mechanisms still have a number of drawbacks, including inefficient use of computing resources and network bandwidth. Moreover, storage compaction can create a burden for garbage collection in the physical drives, because compaction can create invalid data.

SUMMARY

One embodiment described herein provides a system and method for data compaction in a storage system comprising a plurality of storage nodes. During operation, in response to determining that data compaction is triggered, the system regroups valid data from a first set of data chunks stored in the storage system into a second set of data chunks such that a respective data chunk from the second set of data chunks comprises contiguous valid data slices. The system further performs error-correction-coding protection on the second set of data chunks. A physical location associated with a respective valid data slice remains unchanged subsequent to the error-correction-coding protection.

In a variation on this embodiment, performing the error-correction-coding protection can include: selecting an existing error-correction-coding codeword associated with the respective valid data slice, with the existing error-correction-coding codeword comprising multiple portions that are separately stored in a predetermined set of storage nodes; in response to determining that at least one portion of the existing error-correction-coding codeword comprises invalid data, constructing a new error-correction-coding codeword based at least on remaining portions of the existing error-correction-coding codeword that comprise valid data; and writing the constructed new error-correction-coding codeword into the predetermined set of storage nodes.

In a further variation, constructing the new error-correction-coding codeword can further include: in response to receiving new data to be stored in the storage system, replacing the at least one portion of the existing error-correction-coding codeword that comprises invalid data with a corresponding portion of the received new data; and computing new parity based on the corresponding portion of the received new data and the remaining portions of the existing error-correction-coding codeword that comprise valid data.

In a further variation, writing the constructed new error-correction-coding codeword can include: writing the corresponding portion of the received new data in a same storage node storing the replaced at least one portion of the existing error-correction-coding codeword that comprises invalid data; writing the computed new parity in same storage nodes storing parity of the existing parity-coding codeword; and keeping the remaining portions of the existing error-correction-coding codeword that comprise valid data in their current physical locations.

In a further variation, constructing the new error-correction-coding codeword can include: in response to not receiving new data to be stored in the storage system, replacing the at least one portion of the existing error-correction-coding codeword that comprises invalid data with a corresponding portion of valid data currently located on a same storage node; and computing new parity based on the corresponding portion of valid data and the remaining portions of the existing error-correction-coding codeword that comprise valid data.

In a further variation, writing the constructed new error-correction-coding codeword can include: writing the computed new parity in same storage nodes storing parity of the existing parity-coding codeword; and keeping the remaining portions of the existing error-correction-coding codeword that comprise valid data and the corresponding portion of valid data in their current physical locations.

In a further variation, the system can further invalidate parity portions of the existing error-correction-coding codeword such that the invalidated parity portions are subject to garbage collection along with the at least one portion of the existing error-correction-coding codeword that comprises invalid data.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

In this disclosure, a method and system is provided for improving computation and bandwidth efficiency of erasure-coding-based compaction. More specifically, when applying erasure-coding based protection during compaction, the system can identify, from existing erasure-coding codewords stored in physical drives, a codeword that includes invalid user data. The system can generate a new codeword by replacing the invalid user data with incoming new data or other valid user data collocated on the same drive with the invalid user data and computing new parity for the new codeword. Instead of randomly writing the newly generated erasure-coding codeword into different storage locations, the system keeps the original valid data in its original physical location, and writes the replaced data and newly generated parity into the same drives where the invalid data and the old parity reside. This approach improves the compaction efficiency, because the amount of data to be written during compaction is reduced. Moreover, this approach decouples garbage collection, which is performed by the physical drives in the physical domain, from the compaction, which is performed by the file system in the logical domain, thus re-allocating abundant resources from background operations to accommodate the clients' requests with enhanced performance and service-level agreement (SLA).

Erasure-Coding-Based Compaction

Figure 1:
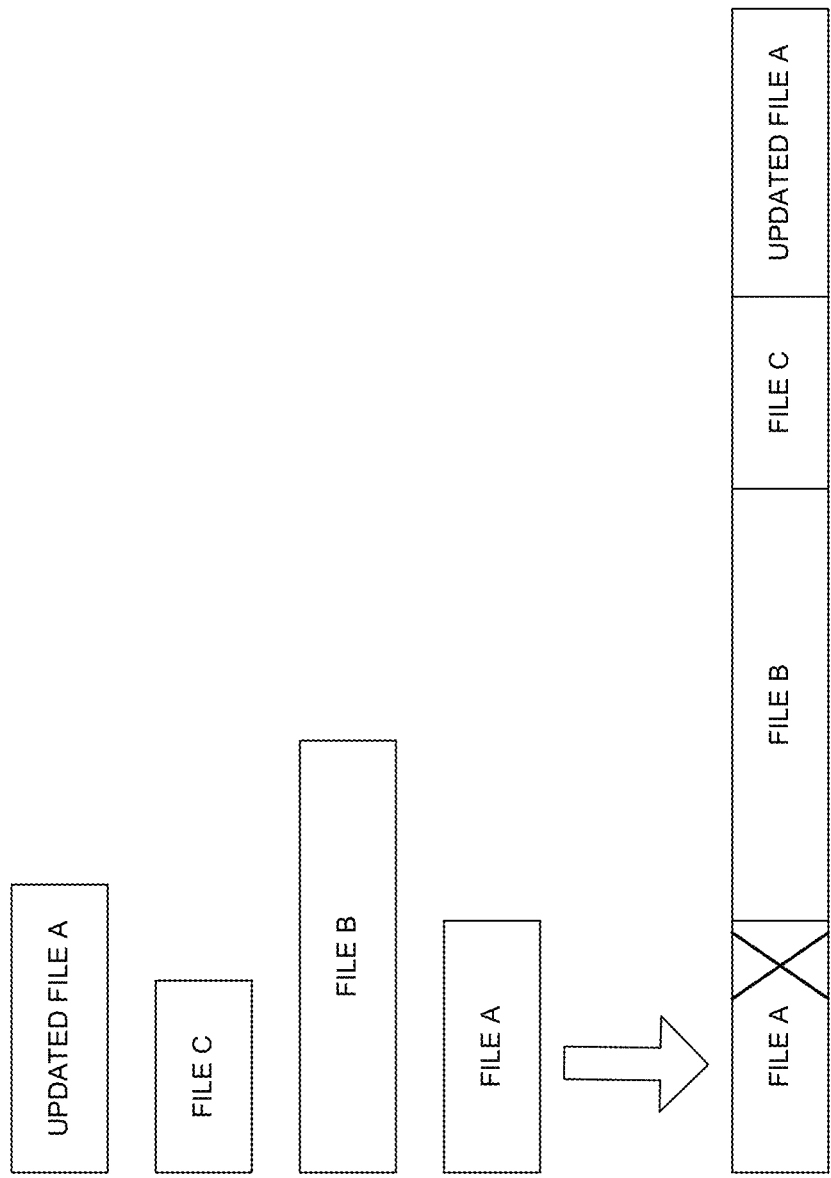
FIG. 1 illustrates holes created in logical blocks resulting from file updates.
Figure 2A:
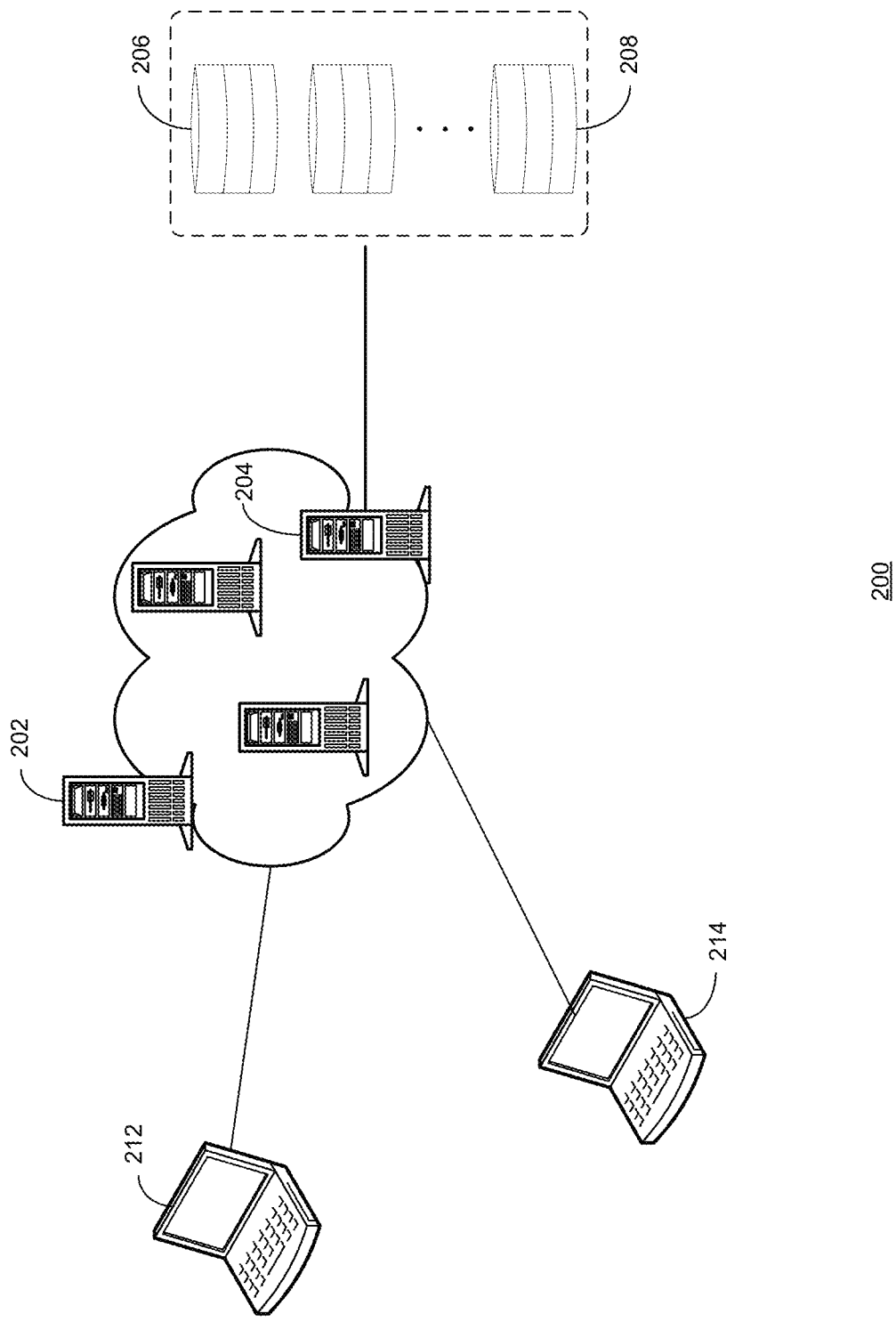
FIG. 2A illustrates an exemplary distributed storage system.

FIG. 2A illustrates an exemplary distributed storage system. Distributed storage system 200 can include a number of storage servers (e.g., servers 202 and 204), with each server managing a number of physical drives. For example, storage server 204 can manage a number of physical drives, including drives 206 and 208. The storage servers can reside in the cloud. A number of client machines (e.g., clients 212 and 214) can access data stored in the physical drives via the storage servers.

To ensure data availability, erasure-coding techniques can be used. Erasure-coding encodes and partitions data into fragments and calculate parity so that in the event of a disk or node failure, the original data can be reconstructed. The number of data and parity blocks is configured based on the desired number of failures to withstand. When a distributed file system performs compaction, valid user data are read out, encoded using an erasure-coding technique (e.g., Reed-Solomon algorithm), and stored into a number of drives. For example, a typical 4+2 erasure-coding technique can split a data object into four portions and add two parity portions that are calculated based on the four data portions. The resulting six portions can be stored into six different drives. The original data can be recovered even if two out of the six drives fail.

Figure 2B:
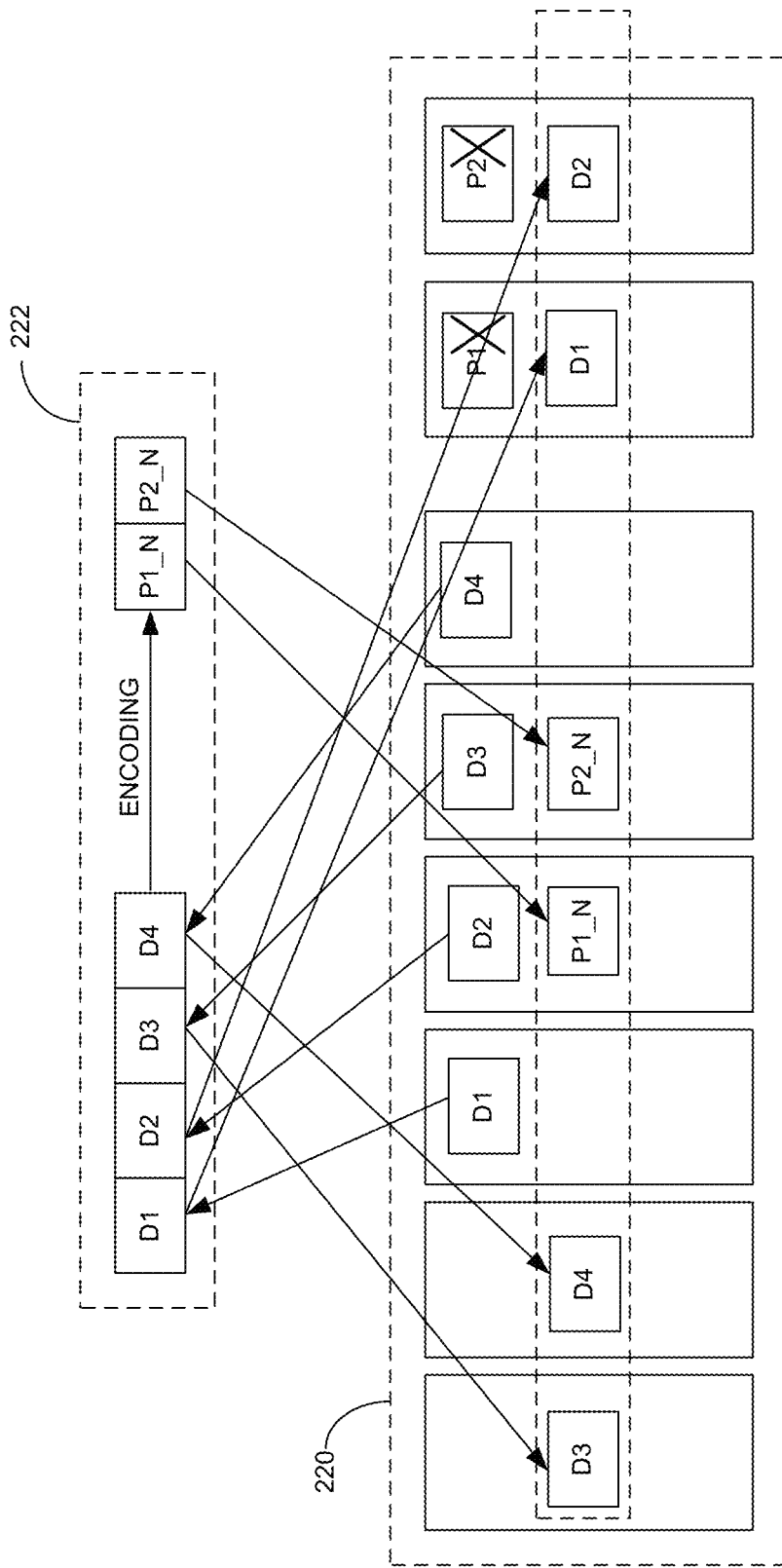
FIG. 2B illustrates a conventional compaction process using erasure coding, according to prior art.

FIG. 2B illustrates a conventional compaction process using erasure coding, according to prior art. During a conventional compaction operation, valid user data is read from the storage nodes, a copy of the user data is made and stored to different locations, and storage locations of the original data are recycled. In FIG. 2B, a number of user data portions (e.g., D1, D2, D3, and D4) of a particular erasure-coding codeword are read out from various storage nodes of a distributed storage system 220 during compaction. The user data can be transferred via network communication links (e.g., Ethernet links) to a compute node capable of performing the erasure-coding encoding operation. At the compute node, a new erasure-coding codeword 222 can be generated using an encoding technique based on the erasure-coding. The new codeword can include the user data portions (e.g., D1, D2, D3, and D4) and the newly generated parity data (e.g., P1_N and P2_N). The compute node can subsequently send the new codeword to the storage nodes. More specifically, the different portions of the new codeword, including user data portions D1, D2, D3, and D4 and new parity data P1_N and P2_N, can be randomly dispersed among the various storage nodes of storage system 220. After the storage of the new codeword, the original user data portions and the original parity data can be invalidated and their corresponding storage locations recycled.

As discussed previously, this conventional compaction approach is inefficient in terms of computing resources and network bandwidths, because all user data, even the valid portions, needs to be re-encoded and transferred over the communication link to a storage medium, and then the original storage locations of the user data are invalidated. The large amount of invalidated data can trigger garbage collection on solid state drives (SSDs), which can then lead to multiple folds of write amplification. It is desirable to reduce the amount of data that needs to be encoded and transferred. Embodiments disclosed herein describe an efficient compaction technique for a distributed storage system implementing erasure coding. More specifically, during compaction, instead of reading and applying erasure coding on all valid data, the system only re-encodes an erasure-coding codeword if the original codeword includes invalid data.

Using FIG. 2B as an example, if during compaction, the system determines that an erasure-coding codeword only includes valid user data portions (i.e., D1, D2, D3, and D4 are all valid), the system can choose to leave these valid user data portions and their corresponding parity data at their original storage locations. There is no need to read these data out, apply erasure coding, and write the codeword back to storage. This can significantly reduce consumption of the computing and networking resources. On the other hand, during compaction, if the system determines that any of the user data portions of a codeword includes invalid data, the system needs to read out the remaining valid data and generate a new erasure-coding codeword for the remaining valid data. For example, if D1 becomes invalid, the system can read out, from the storage nodes, remaining valid user data portions D2-D4 and generate a new erasure-coding codeword for data portions D2-D4. Because the erasure-coding codeword typically has a fixed length, additional user data will be needed to replace D1 in the codeword. The additional user data may be incoming user data or other valid user data stored in the storage nodes.

Figure 3:
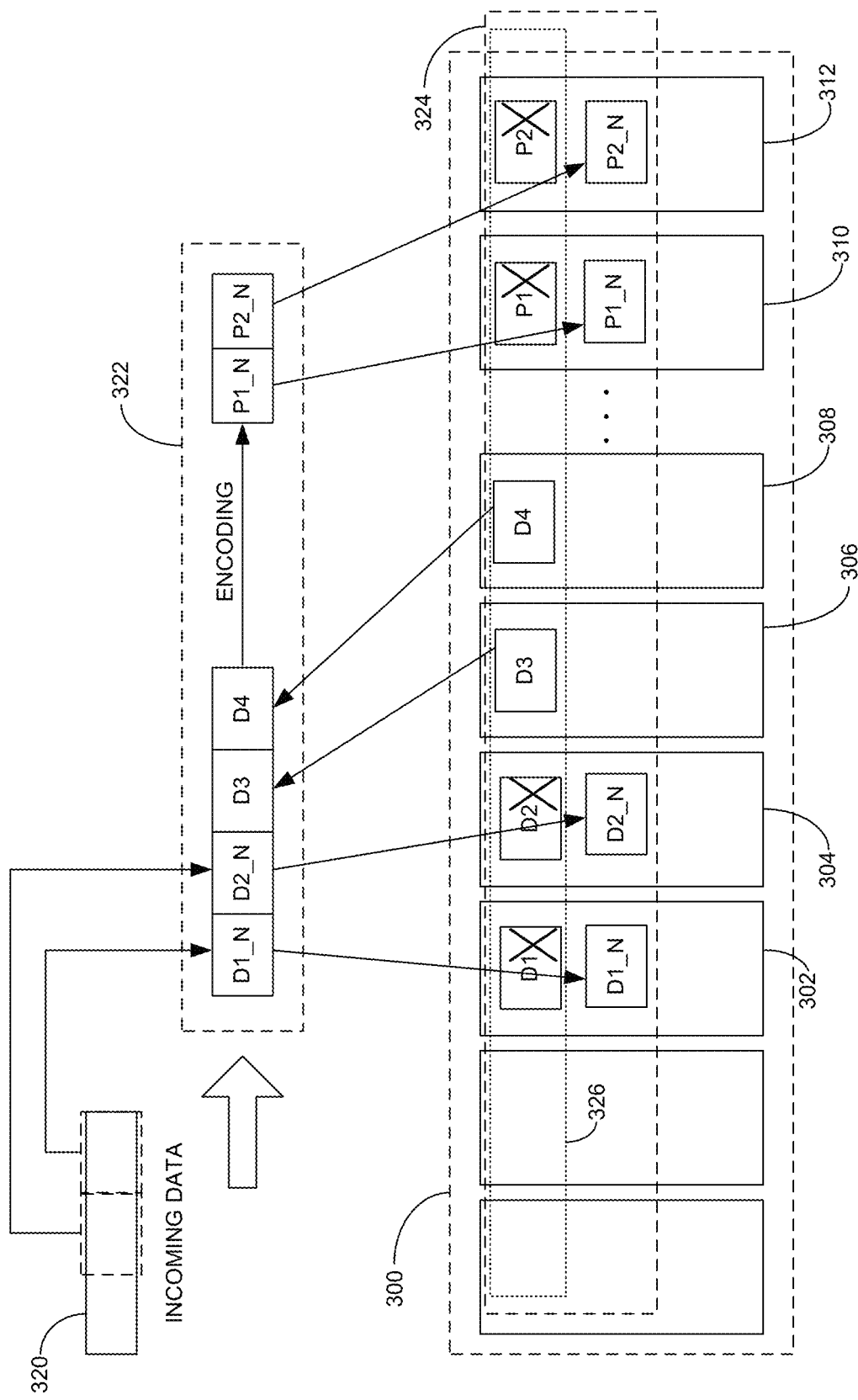
FIG. 3 illustrates an exemplary scenario of the novel erasure-coding-based compaction, according to one embodiment.

FIG. 3 illustrates an exemplary scenario of the novel erasure-coding-based compaction, according to one embodiment. In FIG. 3, an erasure-coding codeword (sometimes referred to as an erasure-coding (EC) stripe) can include user data portions D1, D2, D3, and D4, and parity portions P1 and P2. In the example shown in FIG. 3, user data portions D1, D2, D3, and D4 are stored in storage nodes 302, 304, 306, and 308, respectively, of a distributed storage system 300. D1 and D2 contain expired data (e.g., data that has been updated or deleted), whereas D3 and D4 contain valid user data.

In the scenario shown in FIG. 3, clients of distributed storage system 300 keep sending new data 320 for storage into the storage nodes (e.g., storage nodes 302-308) while storage system 300 serves the frontend clients with high priority. For example, files (e.g., user data D1 and D2) stored in storage system 300 can be updated, creating holes in the data chunks. Compaction can be triggered, when the space occupied by the holes exceeds a certain threshold. During compaction, the system reads out the remaining valid user data portions D3 and D4 from the corresponding storage nodes (e.g., storage nodes 306 and 308). In order to form a new erasure-coding codeword 322, the system can use portions of incoming client data 320 to fill the empty slots in erasure-coding codeword 322. The compute node can perform an erasure-coding encoding operation to generate new parity data P1_N and P2_N. After encoding, erasure-coding codeword 322 can include new data portions D1_N and D2_N, unchanged data portions D3 and D4, and new parity portions P1_N and P2_N. The compute node can then send the erasure-coding codeword 322 to the storage nodes for storage.

Unlike the conventional approach shown in FIG. 2B, where the different portions of an erasure-coding codeword are stored into a new set of randomly selected storage nodes, in the exemplary embodiment shown in FIG. 3, the system maintains the same erasure-coding grouping during compaction, which means that the different portions of the new erasure-coding codeword are stored into the same storage nodes that store the original codeword before compaction. More specifically, during compaction, the system can obtain the erasure-coding grouping information (e.g., information regarding which storage nodes are configured to store the different portions) of a codeword from the metadata of the stored codeword, and choose the same erasure-coding group to store the updated or newly formed codeword.

In the example shown in FIG. 3, storage nodes 302-312 form an erasure-coding group that stores the different portions of erasure-coding codeword 322. During compaction, the new data portions (e.g., D1_N and D2_N) that replace the expired data portions (e.g., D1 and D2) in erasure-coding codeword 322 are sent to the same storage nodes that store the expired data portions. More specifically, in FIG. 3, new data D1_N and D2_N are sent to storage nodes 302 and 304, which also store the expired data D1 and D2, respectively. Similarly, the new parity data (e.g., P1_N and P2_N) can also be sent to the same storage nodes (e.g., storage nodes 310 and 312, respectively) that store the original parity data. However, because D3 and D4 remain valid, there is no need to write them again into storage nodes 306 and 308. In FIG. 3, new data D1_N and D2_N, original data D3 and D4, and new parity P1_N and P2_N stored in the various storage nodes of distributed storage system 300 form a new EC stripe 324. EC stripe 324 can have the same stripe setting as the previous EC stripe 326 that includes user data D1, D2, D3, and D4, and parity data P1 and P2. After compaction, expired user data D1 and D2, and old parity data P1 and P2 can be collected as invalid data. More particularly, the file system can remove mappings to these invalid data, and their storage location can be subject to garbage collection by the physical drives.

As one can see from FIG. 3, when implementing this novel compaction technique, only the new data portions (e.g., D1_N and D2_N) and the new parity (e.g., P1_N and P2_N) are written into the storage nodes, whereas the original, valid user data portions (e.g., D3 and D4) do not need to be written back to the storage nodes. This can significantly reduce the amount of data that need to be written during compaction. Moreover, this also reduces the amount of data being transferred between the compute node and the storage nodes, thus reducing the bandwidth consumption.

Similar compaction techniques can also be used when there is no new incoming data. For example, files may be deleted instead of being updated. During compaction, spaces holding the deleted files need to be recycled and remaining valid data need to be read out and encoded using erasure-coding. More specifically, new erasure-coding codewords or stripes need to be generated using remaining valid user data. When there is no incoming data to fill the empty slots of an EC stripe left by expired user data, existing user data from other EC stripes can be used to fill such empty slots. In some embodiments, during compaction, EC stripes of the same EC group can reassemble to form new, compacted EC stripes.

Figure 4:
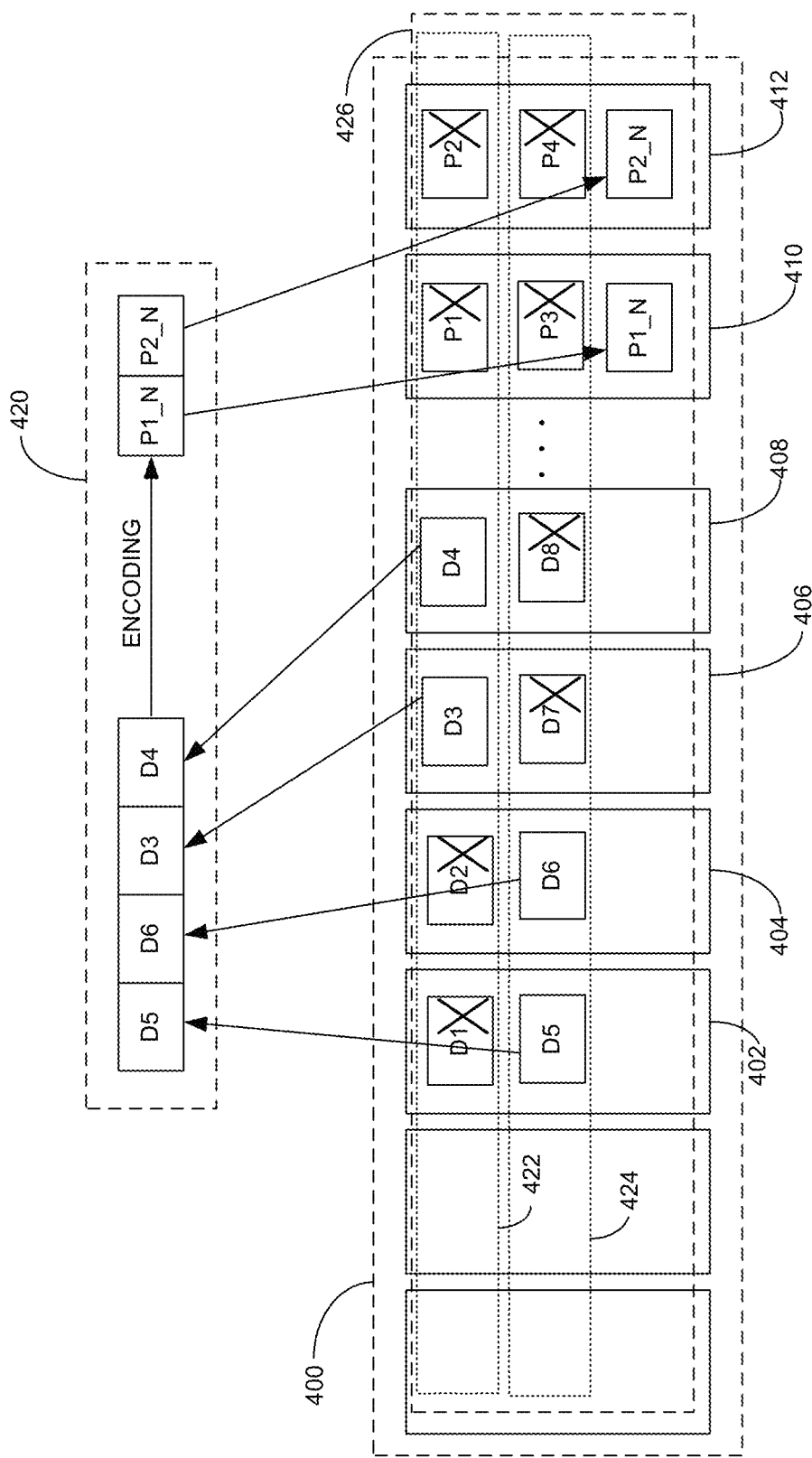
FIG. 4 illustrates an exemplary scenario of the novel erasure-coding-based compaction, according to one embodiment.

FIG. 4 illustrates an exemplary scenario of the novel erasure-coding-based compaction, according to one embodiment. In FIG. 4, a distributed storage system 400 can include a number of storage nodes (e.g., storage nodes 402-412), and can implement an erasure-coding-based compaction technique. During compaction, the system can select an EC stripe 422 for compaction. The different portions of EC stripe 422, including user data portions (e.g., D1, D2, D3, and D4) and parity portions (e.g., P1 and P2), are separately stored on different storage nodes (e.g., nodes 402-412) in storage system 400. D1 and D2 each include expired user data (e.g., deleted files), whereas D3 and D4 each include valid user data. Valid user data D3 and D4 can be read out by a compute node, which is responsible for performing the erasure-coding encoding operation. As discussed previously, the EC codeword has a fixed length and additional data blocks are needed to fill the empty slots in the EC codeword. In the example shown in FIG. 4, the system can use other valid user data blocks that are stored on the same storage nodes storing the expired user data to fill the empty slots in the EC codeword. For example, expired user data D1 resides on storage node 402, and valid user data (e.g., D5) that resides on the same storage node 402 can be used to replace expired user data D1 in the newly assembled EC codeword 420. Similarly, expired user data D2 resides on storage node 404, and valid user data (e.g., D6) that resides on the same storage node 404 can be used to replace D2 in the newly assembled EC codeword 420. Note that D5 and D6 belong to a different EC stripe 424, which also includes expired user data portions D7 and D8. The newly assembled EC codeword 420 can include user data D5, D6, D3, and D4, and newly computed parity P1_N and P2_N. P1_N and P2_N are computed based on user data D5, D6, D3, and D4.

Subsequent to the EC encoding, the system can write newly generated EC codeword 420 to the storage nodes.

Because this novel compaction technique keeps the EC grouping unchanged during compaction, the different portions of EC codeword 420 are written into the same set of storage nodes storing the original EC stripes 422 and 424. More specifically, valid user data D3, D4, D5, and D6 can remain on original storage nodes 406, 408, 402, and 404, respectively; there is no need to make additional copies of these data portions. On the other hand, the newly computed parity P1_N and P2_N can be stored in the same storage nodes storing the original, now invalidated parities. In the example shown in FIG. 4, P1_N and P2_N can be stored in storage nodes 410 and 412, respectively. Subsequent to the compaction, old EC stripes 422 and 424 are consolidated to form a new EC stripe 426, which include user data D5, D6, D3, and D4, and parity P1_N and P2_N.

As one can see from FIG. 4, in the scenario where existing valid user data is used to form a new EC stripe, the compute node only needs to read valid user data from the storage nodes and there is no need to write the data back. The only data that needs to be written back are the newly computed parity data P1_N and P2_N. Compared to the conventional approach shown in FIG. 2, this novel approach can reduce the amount of data written and the bandwidth usage. Moreover, the compaction process itself does not cause the moving of valid user data (thus no write amplification), and it does not add a burden to garbage collection. In fact, in embodiments of the present invention, the compaction performed in the logical domain by the file system and the garbage collection performed by the physical drives are decoupled from each other.

Figure 5:
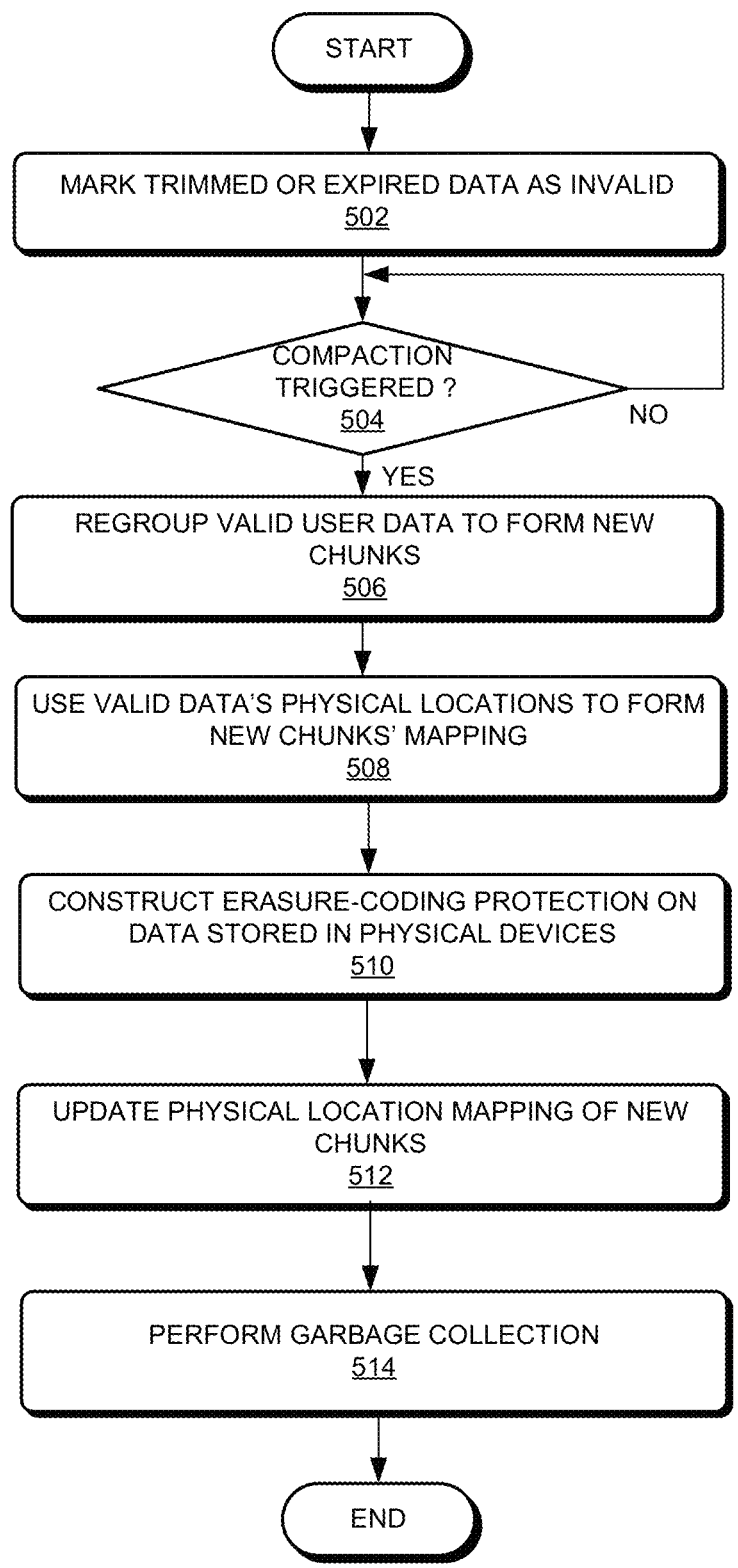
FIG. 5 presents a flowchart illustrating an exemplary compaction process performed by a file system, according to one embodiment.

FIG. 5 presents a flowchart illustrating an exemplary compaction process performed by a file system, according to one embodiment. During operation, the file system can mark trimmed or expired data as invalid (operation 502). Data marked as invalid is ready for compaction. The file system can determine whether compaction is triggered (operation 504). The compaction can be triggered manually or it can be triggered automatically based on one or more predetermined compaction strategies (e.g., a schedule- or usage-based compaction strategy).

Figure 6:
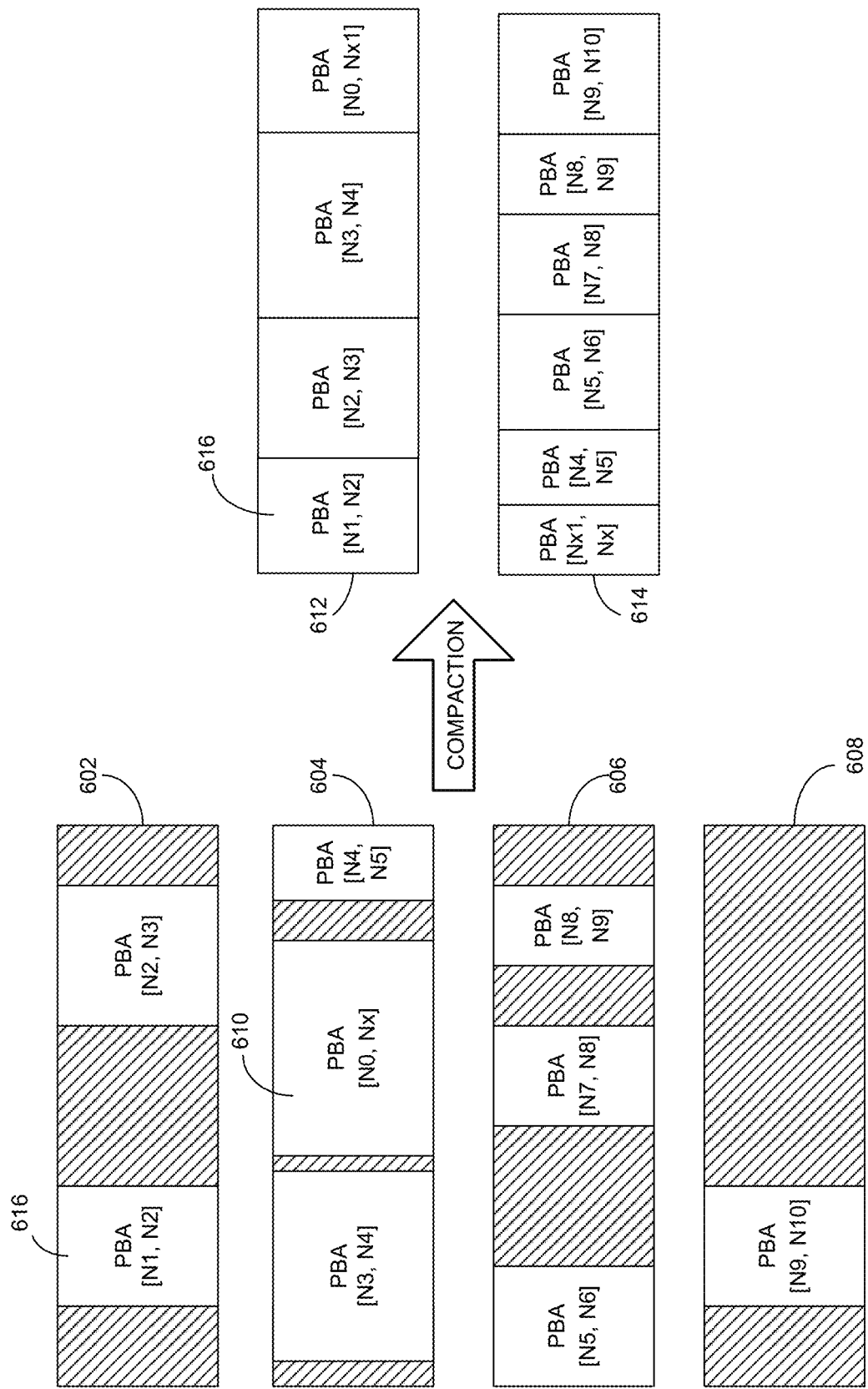
FIG. 6 illustrates the regrouping of the valid user data by the file system, according to one embodiment.

If the compaction is not triggered, the system waits (operation 504). If the compaction is triggered, the file system can regroup valid data to form new chunks (operation 506) and use the valid data's physical locations (e.g., physical block addresses (PBAs)) to form the new chunks' address mapping (operation 508). For example, a pre-compaction data chunk may include expired data as well as valid data, and the compactor can regroup valid data from multiple pre-compaction data chunks to form a new data chunk that only includes valid data. FIG. 6 illustrates the regrouping of the valid user data by the file system, according to one embodiment. In the example shown in FIG. 6, before compaction, data chunks 602, 604, 606, and 608 can each have both expired data (shown as hatched regions) and valid user data. The PBA of each valid user data segment or slice is shown in FIG. 6. During compaction, the file system can regroup the valid user data segments from chunks 602-608 to form two new data chunks 612 and 614. Note that, in this example, user data segment 610 may expand both data chunks 612 and 614. Also note that the regrouping of the valid user data is performed in the logical domain.

Returning to FIG. 5, to ensure data reliability and availability, the file system also needs to construct the erasure-coding protection on data stored in the physical devices or drives (operation 510). The physical drives can include hard disk drives (HDDs), solid-state drives (SSDs), or both. The processes of applying erasure-coding protection have been discussed in more detail previously. In addition to the erasure-coding, other types of error-correction-coding techniques can also be used to protect the data stored in the physical devices or drives. Subsequent to applying the erasure-coding protection, the system can update the physical location mapping of the new chunks (operation 512). The system can further perform garbage collection on the physical drives when needed (operation 514). Note that the garbage collection on the physical drives is decoupled from the compaction performed by the file system in the logical domain, because other than the expired parity, the compaction operation does not invalidate additional data that may trigger garbage collection.

From FIG. 6, one can see that, after the compaction with the erasure-coding protection, the physical addresses (i.e., PBAs) of the valid user data remain the same. For example, before compaction, the PBA of user data segment or slice 616 ranges from N1 to N2. After compaction, the same user data segment or slice (slice 616) in new data chunk 612 has the same PBA range. This is because this novel compaction technique does not move the valid user data stored in the physical drives. As discussed previously, not moving valid user data during compaction can significantly reduce the overall data moved and overwritten, and consequently, reduces the resource consumption, including network bandwidth, computation load, throughput, and write amplification. The decoupling of compaction in the logical domain and garbage collection in the physical domain reallocates abundant resources from background operations to accommodate frontend clients' requests with enhanced performance and SLA.

Figure 7:
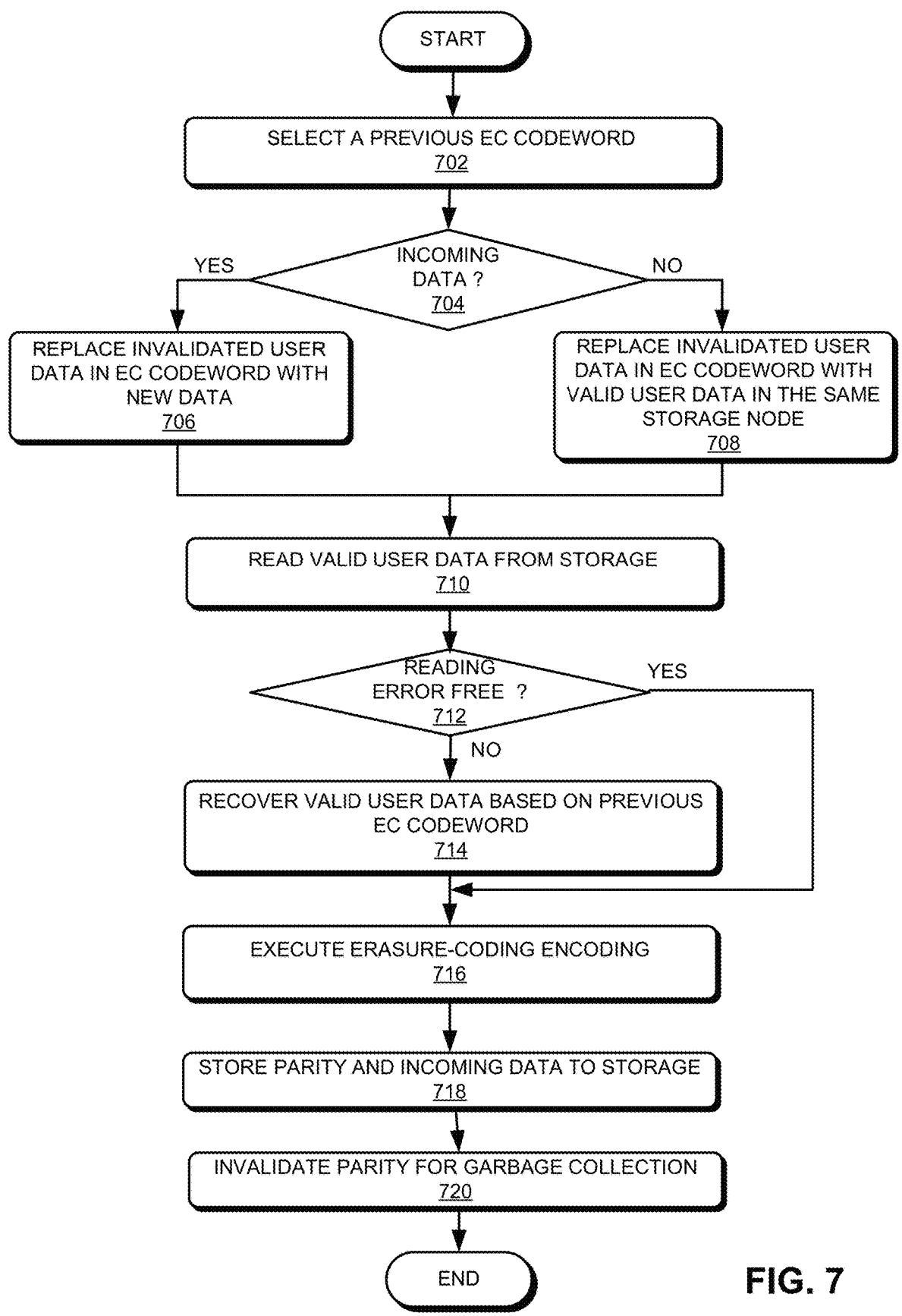
FIG. 7 presents a flowchart illustrating an exemplary process for applying erasure-coding protection, according to one embodiment.

FIG. 7 presents a flowchart illustrating an exemplary process for applying erasure-coding protection, according to one embodiment. During operation, the system selects a previous erasure-coding codeword for re-encoding (operation 702). Such an erasure-coding codeword may be associated with a valid data slice in the compacted data chunk (e.g., data chunks 612 and 614 in FIG. 6). The selected erasure-coding codeword contains invalidated user data. The system determines if there is incoming user data (operation 704). If so, the system can construct a new erasure-coding codeword by replacing invalidated user data in the previous codeword with incoming user data (operation 706). Such a process can be similar to the one shown in FIG. 3. If not, the system can construct an erasure-coding codeword using other valid user data residing on the same storage node as that of an expired user data portion or slice (operation 708). Such a process can be similar to the one shown in FIG. 4.

The system can subsequently read the valid user data that forms the erasure-coding codeword from the corresponding storage nodes or drives (operation 710) and determines if the read is error free (operation 712). If an error occurs, the system can recover the valid user data based on the previous erasure-coding codeword by reading the old parity data and the expired user data in the previous codeword (operation 714). Operation 714 can be skipped if the valid user data is read error free. In such a scenario, the system executes the erasure-coding encoding operation, which can include computing the new parity data based on the newly formed erasure-coding codeword (operation 716). The system then writes the new parity and incoming user data (when applicable) into the storage nodes (operation 718). Note that there is no need to write the valid user data; they are kept at the same physical location within the storage system. If incoming user data replaces expired user data in the erasure-coding codeword, the incoming user data is written into the same storage nodes or drives where the expired user data resides.

The system can further invalidate the old parity, thus subjecting the old parity and the expired user data to garbage collection performed by the corresponding physical drive (operation 720).

In general, embodiments disclosed herein provide an efficient compaction technique for a log-structured distributed file system. More specifically, when implementing the novel erasure-coding-based compaction scheme, the system minimizes the amount of data that needs to be moved or written on physical drives. More specifically, when applying erasure-coding protection on data stored on the physical drives, instead of constructing a new erasure-coding codeword using random data, the system maintains the erasure-coding grouping of an existing erasure-coding codeword by using new user data or user data from the same storage node or drive to replace expired user data slices in the existing erasure-coding codeword. In addition, after the erasure-coding encoding process, only new parity data and new user data need to be written into physical drives; existing valid user data on the physical drives does not need to move. The expired user data and parity data can be subject to garbage collection performed by the physical drives. The compaction does not cause additional burdens for garbage collection.

Exemplary Computer System and Apparatus

Figure 8:
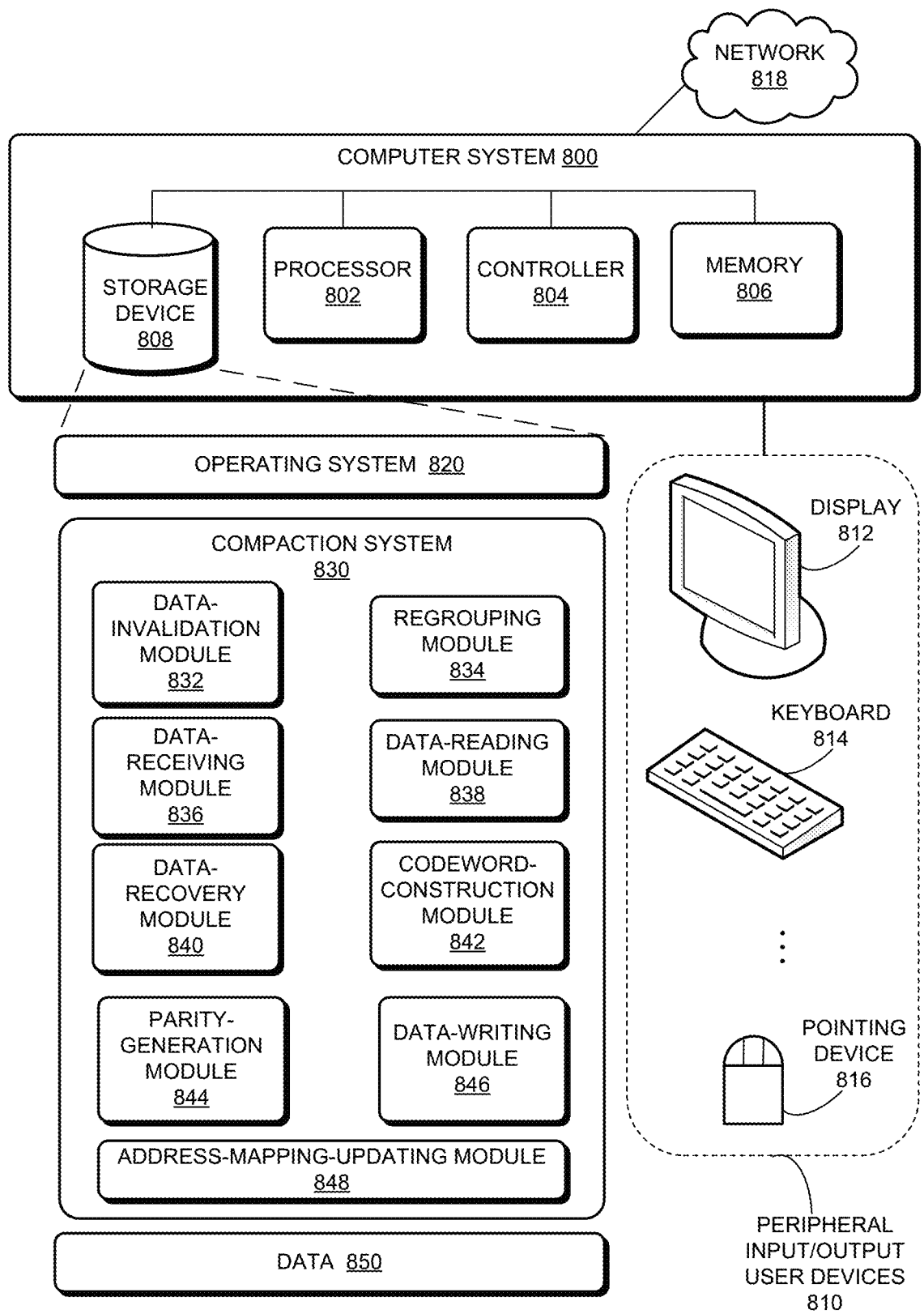
FIG. 8 illustrates an exemplary computer system that facilitates efficient erasure-coding-based compaction, according to one embodiment.

FIG. 8 illustrates an exemplary computer system 800 that facilitates efficient erasure-coding-based compaction, according to one embodiment. Computer system 800 can include a processor 802, a controller 804, a memory 806, and a storage device 808. Controller 804 can be part of computer system 800 and can be further associated with a storage drive (not shown), which is associated with or coupled to computer system 800. Memory 806 can include, e.g., random access memory (RAM) that serves as a managed memory, and can be used to store one or more memory pools. Storage device 808 can include persistent storage that can be managed or accessed via processor 802 (or controller 804). Furthermore, computer system 800 can be coupled to peripheral input/output (I/O) user devices 810 (e.g., a display device 812, a keyboard 814, and a pointing device 816) and a network 818. Storage device 808 can store an operating system 820, a compaction system 830, and data 850.

Compaction system 830 can include instructions, which when executed by computer system 800, can cause computer system 800 or processor 802 to perform methods and/or processes described in this disclosure. Specifically, compaction system 830 can include instructions for invalidating expired user data (data-invalidation module 832) and instructions for regrouping valid user data into new data chunks (regrouping module 834).

Compaction system 830 can include instructions for receiving incoming data (data-receiving module 836), instructions for reading valid user data from storage (data-reading module 838), and instructions for recovering user data in the event of read errors (data-recovery module 840).

Compaction system 830 can include instructions for constructing erasure-coding codewords (codeword-construction module 842) and instructions for generating parity data (parity-generation module 844).

Compaction system 830 can additionally include instructions for selectively writing portions of a newly generated erasure-coding codeword into physical drives (data-writing module 846) and for updating physical address mappings (address-mapping-updating module 848).

Data 850 can include any data that is required as input or generated as output by the methods and/or processes described in this disclosure. Specifically, data 850 can store at least: user data; parity data; a request; a read request; a write request; an input/output (I/O) request; data associated with a read request, a write request, or an I/O request; a logical block address (LBA); a physical block address (PBA); metadata associated with a logical data chunk or a physical data chunk.

Figure 9:
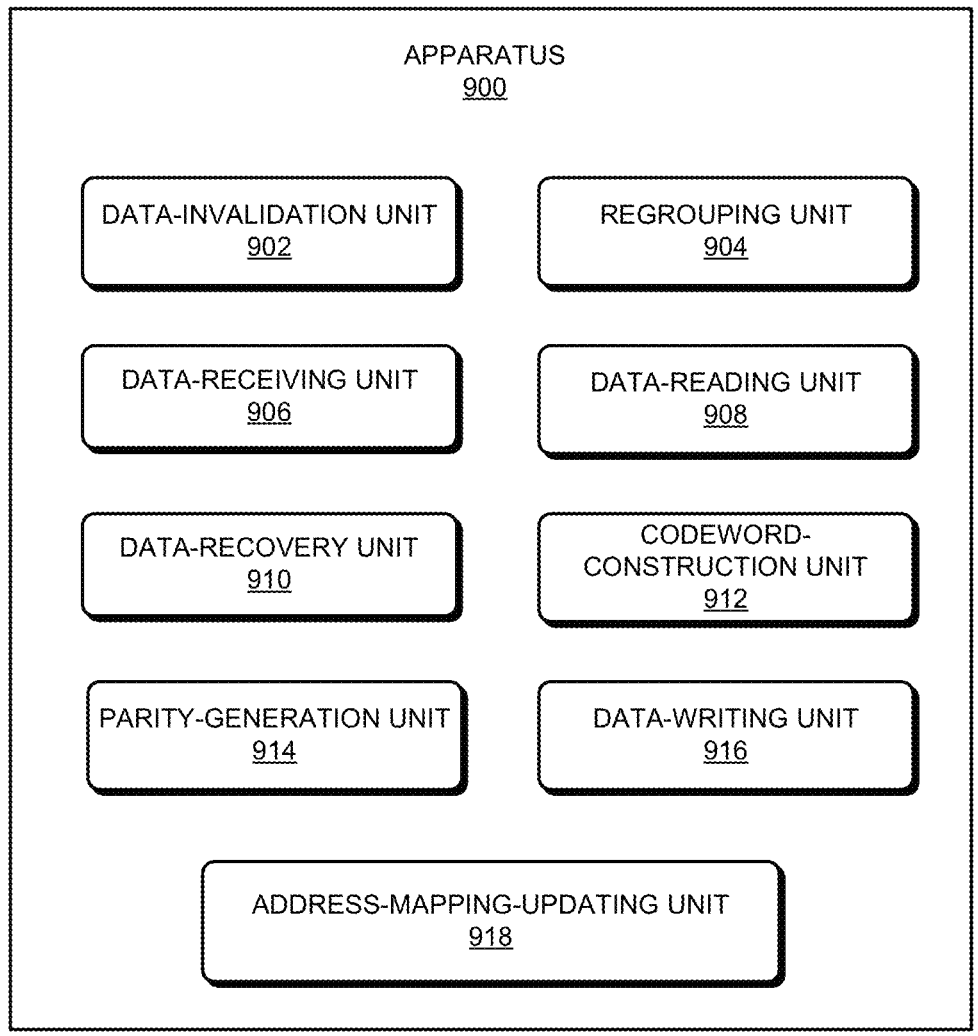
FIG. 9 illustrates an exemplary apparatus that facilitates efficient erasure-coding-based compaction, according to one embodiment.

FIG. 9 illustrates an exemplary apparatus 900 that facilitates efficient erasure-coding-based compaction, according to one embodiment. Apparatus 900 can comprise a plurality of units or apparatuses which may communicate with one another via a wired, wireless, quantum light, or electrical communication channel. Apparatus 900 may be realized using one or more integrated circuits, and may include fewer or more units or apparatuses than those shown in FIG. 9. Further, apparatus 900 may be integrated in a computer system, or realized as a separate device or devices capable of communicating with other computer systems and/or devices. Specifically, apparatus 900 can comprise modules or units 902-918 which are configured to perform functions or operations similar to modules 832-848 of computer system 800 of FIG. 8, including: a data-invalidation unit 902; a data-regrouping unit 904; a data-receiving unit 906; a data-reading unit 908; a data-recovery unit 910; a codeword-construction unit 912; a parity-generation unit 914; a data-writing unit 916; and an address-mapping-updating unit 918.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for performing data compaction in a storage system comprising a plurality of storage nodes, the method comprising:

in response to determining, by a processor, that data compaction is triggered, regrouping valid data from a first set of data chunks stored in the storage system into a second set of data chunks such that a respective data chunk from the second set of data chunks comprises contiguous valid data slices, wherein a respective valid data slice in the first set of data chunks is stored at a particular physical location and is included in the second set of data chunks; and performing error-correction-coding protection on the second set of data chunks, which comprises:

locating an existing erasure-coding codeword comprising the valid data slice in the first set of data chunks;

constructing a new erasure-coding codeword in response to the existing erasure-coding codeword comprising invalid data; and storing the constructed new erasure-coding codeword in the storage system, wherein the valid data slice included in the constructed new erasure-coding codeword is stored at the same particular physical location.

2. The computer-implemented method of claim 1, wherein the existing erasure-coding codeword comprises multiple portions that are separately stored in a predetermined set of storage nodes; and wherein storing the constructed new error-correction-coding codeword comprises writing the constructed new error-correction-coding codeword into the same predetermined set of storage nodes.

3. The computer-implemented method of claim 1, wherein constructing the new error-correction-coding codeword further comprises:

in response to receiving new data to be stored in the storage system, replacing a portion of the existing error-correction-coding codeword that comprises invalid data with a corresponding portion of the received new data; and computing new parity based on the corresponding portion of the received new data and remaining portions of the existing error-correction-coding codeword that comprise valid data.

4. The computer-implemented method of claim 3, wherein writing the constructed new error-correction-coding codeword further comprises:

writing the corresponding portion of the received new data in a same storage node storing the replaced portion of the existing error-correction-coding codeword that comprises invalid data;

writing the computed new parity in same storage nodes storing parity of the existing parity-coding codeword; and keeping the remaining portions of the existing error-correction-coding codeword that comprise valid data in their current physical locations.

5. The computer-implemented method of claim 1, wherein constructing the new error-correction-coding codeword further comprises:

in response to not receiving new data to be stored in the storage system, replacing a portion of the existing error-correction-coding codeword that comprises invalid data with a corresponding portion of valid data currently located on a same storage node; and computing new parity based on the corresponding portion of valid data and remaining portions of the existing error-correction-coding codeword that comprise valid data.

6. The computer-implemented method of claim 5, wherein storing the constructed new error-correction-coding codeword further comprises:

writing the computed new parity in same storage nodes storing parity of the existing parity-coding codeword; and keeping the remaining portions of the existing error-correction-coding codeword that comprise valid data and the corresponding portion of valid data in their current physical locations.

7. The computer-implemented method of claim 1, further comprising invalidating parity portions of the existing error-correction-coding codeword such that the invalidated parity portions are subject to garbage collection along with the portion of the existing error-correction-coding codeword that comprises invalid data.

8. A computer system, comprising:

a processor; and a storage device coupled to the processor and storing instructions, which when executed by the processor cause the processor to perform a method for performing data compaction in a storage system comprising a plurality of storage nodes, the method comprising:

in response to determining that data compaction is triggered, regrouping valid data from a first set of data chunks stored in the storage system into a second set of data chunks such that a respective data chunk from the second set of data chunks comprises contiguous valid data slices, wherein a respective valid data slice in the first set of data chunks is stored at a particular physical location and is included in the second set of data chunks; and performing error-correction-coding protection on the second set of data chunks, which comprises:

locating an existing erasure-coding codeword comprising the valid data slice in the first set of data chunks;

constructing a new erasure-coding codeword in response to the existing erasure-coding codeword comprising invalid data; and storing the newly constructed erasure-coding codeword in the storage system, wherein the valid data slice included in the constructed new erasure-coding codeword is stored at the same particular physical location.

9. The computer system of claim 8, wherein the existing error-correction-coding codeword comprises multiple portions that are separately stored in a predetermined set of storage nodes; and wherein storing the constructed new error-correction-coding codeword comprises writing the constructed new error-correction-coding codeword into the same predetermined set of storage nodes.

10. The computer system of claim 8, wherein constructing the new error-correction-coding codeword further comprises:

in response to receiving new data to be stored in the storage system, replacing a portion of the existing error-correction-coding codeword that comprises invalid data with a corresponding portion of the received new data; and computing new parity based on the corresponding portion of the received new data and remaining portions of the existing error-correction-coding codeword that comprise valid data.

11. The computer system of claim 10, wherein storing the constructed new error-correction-coding codeword further comprises:

writing the corresponding portion of the received new data in a same storage node storing the replaced portion of the existing error-correction-coding codeword that comprises invalid data;

writing the computed new parity in same storage nodes storing parity of the existing parity-coding codeword; and keeping the remaining portions of the existing error-correction-coding codeword that comprise valid data in their current physical locations.

12. The computer system of claim 8, wherein constructing the new error-correction-coding codeword further comprises:

in response to not receiving new data to be stored in the storage system, replacing the portion of the existing error-correction-coding codeword that comprises invalid data with a corresponding portion of valid data currently located on a same storage node; and computing new parity based on the corresponding portion of valid data and the remaining portions of the existing error-correction-coding codeword that comprise valid data.

13. The computer system of claim 12, wherein storing the constructed new error-correction-coding codeword further comprises:

writing the computed new parity in same storage nodes storing parity of the existing parity-coding codeword; and keeping the remaining portions of the existing error-correction-coding codeword that comprise valid data and the corresponding portion of valid data in their current physical locations.

14. The computer system of claim 8, wherein the method further comprises invalidating parity portions of the existing error-correction-coding codeword such that the invalidated parity portions are subject to garbage collection along with the portion of the existing error-correction-coding codeword that comprises invalid data.

15. A non-transitory computer-readable storage medium storing instructions that when executed by a computer cause the computer to perform a method for performing data compaction in a storage system comprising a plurality of storage nodes, the method comprising:

in response to determining, by a processor, that data compaction is triggered, regrouping valid data from a first set of data chunks stored in the storage system into a second set of data chunks such that a respective data chunk from the second set of data chunks comprises contiguous valid data slices, wherein a respective valid data slice in the first set of data chunks is stored at a particular physical location and is included in the second set of data chunks; and performing error-correction-coding protection on the second set of data chunks, which comprises:

locating an existing erasure-coding codeword comprising the valid data slice in the first set of data chunks;

constructing a new erasure-coding codeword in response to the existing erasure-coding codeword comprising invalid data; and storing the newly constructed erasure-coding codeword in the storage system, wherein the valid data slice included in the newly constructed erasure-coding codeword is stored at the same particular physical location.

16. The computer-readable storage medium of claim 15, wherein the existing error-correction-coding codeword comprises multiple portions that are separately stored in a predetermined set of storage nodes; and wherein storing the constructed new error-correction-coding codeword comprises writing the constructed new error-correction-coding codeword into the predetermined set of storage nodes.

17. The computer-readable storage medium of claim 15, wherein constructing the new error-correction-coding codeword further comprises:

in response to receiving new data to be stored in the storage system, replacing the portion of the existing error-correction-coding codeword that comprises invalid data with a corresponding portion of the received new data; and computing new parity based on the corresponding portion of the received new data and remaining portions of the existing error-correction-coding codeword that comprise valid data.

18. The computer-readable storage medium of claim 17, wherein storing the constructed new error-correction-coding codeword comprises:

writing the corresponding portion of the received new data in a same storage node storing the replaced portion of the existing error-correction-coding codeword that comprises invalid data;

writing the computed new parity in same storage nodes storing parity of the existing parity-coding codeword; and keeping the remaining portions of the existing error-correction-coding codeword that comprise valid data in their current physical locations.

19. The computer-readable storage medium of claim 15, wherein constructing the new error-correction-coding codeword further comprises:

in response to not receiving new data to be stored in the storage system, replacing the portion of the existing error-correction-coding codeword that comprises invalid data with a corresponding portion of valid data currently located on a same storage node; and computing new parity based on the corresponding portion of valid data and remaining portions of the existing error-correction-coding codeword that comprise valid data.

20. The computer-readable storage medium of claim 19, wherein storing the constructed new error-correction-coding codeword further comprises:

writing the computed new parity in same storage nodes storing parity of the existing parity-coding codeword; and keeping the remaining portions of the existing error-correction-coding codeword that comprise valid data and the corresponding portion of valid data in their current physical locations.

* * * * *